(12) United States Patent
Sasaki

(10) Patent No.: US 8,593,615 B2
(45) Date of Patent: Nov. 26, 2013

(54) HEIGHT MEASUREMENT APPARATUS, EXPOSURE APPARATUS, AND DEVICE FABRICATION METHOD

(75) Inventor: Ryo Sasaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 382 days.

(21) Appl. No.: 12/840,553

(22) Filed: Jul. 21, 2010

(65) Prior Publication Data

US 2011/0032504 A1 Feb. 10, 2011

(30) Foreign Application Priority Data

Aug. 10, 2009 (JP) ................................. 2009-186143

(51) Int. Cl.
*G03B 27/52* (2006.01)
*G03B 27/32* (2006.01)

(52) U.S. Cl.
USPC ............................................ 355/55; 355/77

(58) Field of Classification Search
None
See application file for complete search history.

(56) References Cited

U.S. PATENT DOCUMENTS

| | | |
|---|---|---|
| 4,340,306 A | 7/1982 | Balasubramanian |
| 6,970,253 B2 | 11/2005 | Lindner et al. |
| 7,057,742 B2 | 6/2006 | Marron et al. |
| 7,852,489 B2 | 12/2010 | Sugiyama et al. |
| 8,233,140 B2 | 7/2012 | Sasaki |
| 2007/0086013 A1 | 4/2007 | De Lega et al. |
| 2009/0009773 A1 | 1/2009 | Sugiyama et al. |

FOREIGN PATENT DOCUMENTS

| | | |
|---|---|---|
| JP | 2007-333470 A | 12/2007 |
| KR | 10-2005-0119008 A | 12/2005 |
| KR | 10-2009-0034784 A | 4/2009 |
| TW | 200741175 A | 11/2007 |
| TW | 200813654 A | 3/2008 |
| WO | 2007/088789 A1 | 8/2007 |

OTHER PUBLICATIONS

Korean Office Action issued in Korean counterpart application No. KR10-2010-0074657, dated Oct. 16, 2012.
Sasaki, Ryo. "Measurement Apparatus, Exposure Apparatus, and Device Fabrication Method", Specification and Drawings of unpublished related co-pending U.S. Appl. No. 12/840,495, filed Jul. 21, 2020 pp. 1-55.
TW Office Action issued Jul. 10, 2013 for corres. TW 099125098.

*Primary Examiner* — Peter B Kim
*Assistant Examiner* — Michelle Iacoletti
(74) *Attorney, Agent, or Firm* — Rossi, Kimms & McDowell LLP

(57) ABSTRACT

The present invention provides a measurement apparatus which measures a height of a test surface, the apparatus including an image sensing device including a plurality of detection units configured to detect interfering light formed by measurement light from the test surface and reference light from a reference surface, and an optical system configured to guide the measurement light and the reference light to the plurality of detection units, wherein the reference surface is placed such that differences are generated among optical path differences between measurement light beams and reference light beams which enter the plurality of detection units, respectively.

7 Claims, 7 Drawing Sheets

HEIGHT MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

An exposure apparatus is employed to fabricate micropatterned semiconductor devices using photolithography. The exposure apparatus projects and transfers a pattern formed on a reticle (mask) onto a substrate such as a wafer via a projection optical system. In recent years, an exposure apparatus of the step & scan scheme (scanner) has become the mainstream in place of an exposure apparatus of the step & repeat scheme (stepper).

An exposure apparatus of each of these types performs correction in which it measures the surface position of a substrate at a predetermined position defined on it using a surface shape (surface position) measurement means of the light oblique incidence system before exposure (or during exposure), and aligns the substrate surface with an optimum imaging position in exposing the substrate at the predetermined position. This correction is of prime importance especially for a scanner which measures not only the height (focus) of the substrate surface position in the longitudinal direction of the exposure slit (that is, a direction perpendicular to the scanning direction) but also the surface tilt with respect to that direction. U.S. Pat. No. 4,340,306 and U.S. Patent Application Publication No. 2007/0086013 propose details of such techniques.

The so-called white light interference signal scheme is widely used to measure the surface shape of a substrate in an exposure apparatus. In the white light interference signal scheme, white light emitted by a light source is split into two light beams to guide one light beam to a test surface (substrate) and the other light beam to a reference surface. Measurement light reflected by the test surface and reference light reflected by the reference surface are combined, and an interference pattern (interference signal) formed by the interference between the measurement light and the reference light is detected. At this time, as the height position (the position in the Z-axis direction) of the test surface changes, the optical path difference (OPD) between the reference light and the measurement light changes, and the interference signal between the reference light and the measurement light, in turn, changes. This makes it possible to obtain the surface shape of the test surface from the change in interference signal. Note that the conventional white light interference signal scheme requires detecting an interference signal while driving (scanning) the test surface in the height direction for each measurement point. Thus, in this scheme, it takes a relatively long time to measure the three-dimensional shape of the test surface.

U.S. Pat. No. 4,340,306 discloses a technique of shortening the measurement time by two-dimensionally arraying pixels which detect interference signals to widen a measurement region which can be measured by one scanning operation. However, when pixels are arrayed two-dimensionally, and the test surface is larger than the two-dimensional measurement region, it is necessary to divide the test surface into a plurality of regions, and scan it for each of the plurality of regions. Thus, in this technique, it takes a measurement time equal to the product of the number of division and the time taken for each scanning. Although it is possible to array pixels so that the test surface can be measured at once, both the size of an optical system and the number of pixels in a measurement apparatus increase in this case, and this poses problems associated with the cost and arrangement. Also, when a reduction optical system is applied to an optical system in a measurement apparatus for its downsizing, the pixel resolution decreases, and this deteriorates measurement accuracy.

U.S. Patent Application Publication No. 2007/0086013 discloses a technique of measuring the height position of the test surface by placing a spectroscopic device on the incident side of an image sensing device, and detecting the interference intensity for each wavelength on the image sensing device to obtain an interference signal. Since the technique disclosed in U.S. Patent Application Publication No. 2007/0086013 does not require scanning of the test surface in the height direction, it can measure the test surface in a short period of time. However, to obtain high measurement accuracy, it is necessary to improve wavelength resolution. To meet this requirement, a high-precision spectroscopic device and a high-pixel-density image sensing device are necessary, and this poses problems associated with the cost.

SUMMARY OF THE INVENTION

The present invention provides a technique which can measure the surface shape of a test surface in a short period of time while keeping the cost low.

According to one aspect of the present invention, there is provided a measurement apparatus which measures a height of a test surface, the apparatus including an image sensing device including a plurality of detection units configured to detect interfering light formed by measurement light from the test surface and reference light from a reference surface, and an optical system configured to guide the measurement light and the reference light to the plurality of detection units, wherein the reference surface is placed such that differences are generated among optical path differences between measurement light beams and reference light beams which enter the plurality of detection units, respectively, and the plurality of detection units detect the interfering light by moving a relative position between the test surface and a measurement unit including the image sensing device and the optical system so that measurement light beams reflected at a plurality of measurement points on the test surface, and reference light beams reflected at a plurality of reference points on the reference surface enter the plurality of detection units, respectively.

Further features of the present invention will become apparent from the following description of exemplary embodiments with reference to the attached drawings.

DESCRIPTION OF THE EMBODIMENTS

Figure 1:
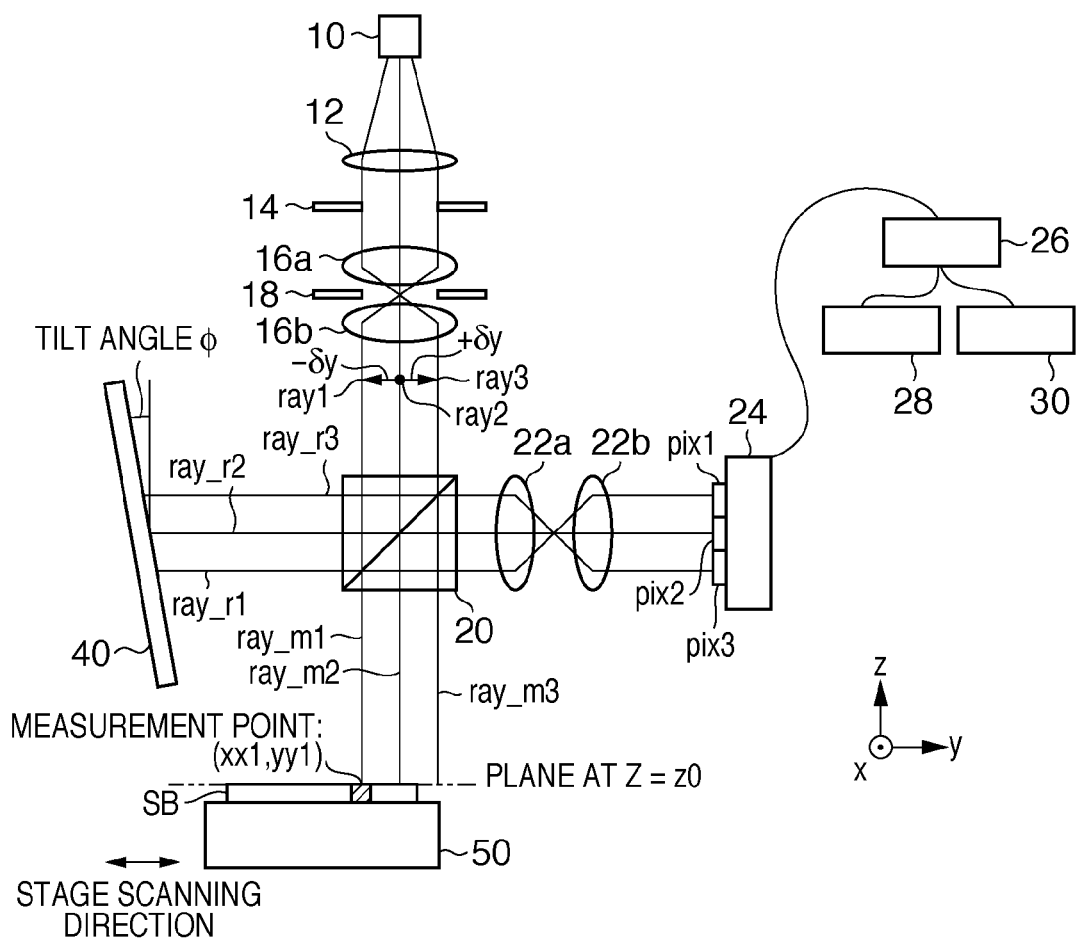
FIG. 1 is a schematic view showing the arrangement of a measurement apparatus according to one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a measurement apparatus 1 according to one aspect of the present invention. The measurement apparatus 1 measures the height (the position in the Z-axis direction) of the surface of a substrate SB as the test surface at each measurement point defined on that surface (within the X-Y plane), and the average height and the average tilt (ωx,ωy) of the surface of the substrate SB in a predetermined region defined on it. In other words, the measurement apparatus 1 measures the surface shape of the substrate SB as the test surface. Also, when a plurality of thin films are formed on the substrate SB, the measurement apparatus 1 measures the heights of the uppermost thin film surface, the interfaces of respective thin films, and the substrate SB, or the thicknesses of respective thin films. In this embodiment, the substrate SB is a wafer onto which the pattern of a reticle is transferred in an exposure apparatus.

The measurement apparatus 1 includes an illumination system, a detection system, a processing system, a reference surface 40, and a stage 50. The illumination system includes a light source 10, a condenser lens 12 which converges light from the light source 10, and a slit plate 14. The detection system includes lenses 16a and 16b which guide light to a measurement point on the substrate SB, an aperture stop 18, a beam splitter 20 which splits and combines light (measurement light and reference light), lenses 22a and 22b, and an image sensing device 24 such as a CCD or a CMOS sensor. However, the image sensing device 24 can also be substituted by an array of a plurality of light amount detection devices such as photodetectors. The processing system includes a calculation processing unit 26, a storage unit 28 which stores data, and a display unit 30 which displays, for example, the measurement result obtained by the measurement apparatus 1 and its measurement condition. The stage 50 holds the substrate SB via a substrate chuck, and drives it in the X-, Y-, and Z-axis directions and rotation directions about the respective axes using, for example, a linear motor.

In this embodiment, the light source 10 is, for example, an LED (for example, a white LED) which emits a light beam in a wide wavelength range, a halogen lamp, or a light source as a combination of a plurality of lasers which emit light beams with different wavelengths in narrow ranges. The wavelength range of light from the light source 10 is 100 nm or more and, more specifically, is about 400 nm to 800 nm. However, when the substrate SB is coated with a resist (photosensitive agent), the light source 10 is configured not to irradiate the substrate SB with light in the wavelength range of ultraviolet rays (350 nm) or shorter wavelengths in order to prevent the resist from being exposed to light. In this embodiment, light from the light source 10 is non-polarized or circularly polarized.

Light from the light source 10 is focused on the slit plate 14 via the condenser lens 12. The slit plate 14 includes a transmission region having a rectangular shape (for example, with a slit width of 50 μm and a slit length of 700 μm) or a mechanical stop having a variable aperture, and the light having passed through the transmission region in the slit plate 14 forms images on the substrate SB and reference surface 40 via the lenses 16a and 16b and aperture stop 18. However, the transmission region in the slit plate 14 is not limited to a rectangular shape (slit), and may have a circular shape (pinhole). Also, the aperture stop 18 is placed at the pupil position of the detection system, and defines the numerical aperture (NA). In this embodiment, the aperture stop 18 defines the NA at about sin(0.1°) to sin(5°).

The principal ray of the light having passed through the lens 16b enters the beam splitter 20 inserted between the lens 16b and the substrate SB. An almost half of the light having passed through the lens 16b is transmitted through the beam splitter 20, and nearly perpendicularly enters the substrate SB. Also, almost the other half of the light having passed through the lens 16b is reflected by the beam splitter 20, and nearly perpendicularly enters the reference surface 40. The beam splitter 20 is, for example, a prism type beam splitter formed from a metal film, a dielectric multilayer film, or another film as a split film, or a pellicle type beam splitter formed from a film (made of, for example, SiC or SiN) as thin as about 1 μm to 5 μm.

Light (to be referred to as "measurement light" hereinafter) which is transmitted through the beam splitter 20 and enters the substrate SB is reflected by the substrate SB and enters the beam splitter 20. On the other hand, light (to be referred to as "reference light" hereinafter) which is reflected by the beam splitter 20 and enters the reference surface 40 is reflected by the reference surface 40 and enters the beam splitter 20. Note that the reference surface 40 is, for example, an aluminum flat plane mirror or glass flat plane mirror with a surface accuracy of about 10 nm to 20 nm.

The measurement light reflected by the substrate SB and the reference light reflected by the reference surface 40 are combined by the beam splitter 20, and received by the image sensing device 24 via the lenses 22a and 22b. The measurement light and the reference light are superposed on each other (that is, interfere with each other) on the image sensing device 24, and the intensity of interfering light formed by the measurement light and the reference light is detected by the image sensing device 24. The substrate SB and reference surface 40 and the image sensing device 24 are arranged in an imaging relationship. Although the slit plate 14 and the substrate SB are also arranged in an imaging relationship in this embodiment, they may be arranged to serve as a pupil plane and an image plane, respectively.

To control the position of the stage 50 which holds the substrate SB with high accuracy, laser interferometers (not shown) are placed on five axes: the X-, Y-, and Z-axes and tilt axes ωx and ωy in this embodiment. The surface shape of the substrate SB can be measured with higher accuracy by performing closed-loop control of the position of the stage 50 based on the outputs from these laser interferometers. The use of laser interferometers is especially advantageous when the entire surface shape of the substrate SB is obtained by dividing the substrate SB into a plurality of regions and measuring these divided regions, because this allows more precise concatenation (stitching) of shape data.

The placement of the reference surface 40 and the optical path difference (OPD) between the reference light and the measurement light in the measurement apparatus 1 will be explained herein. As shown in FIG. 1, the principal ray of the light to be split by the beam splitter 20 is defined as a principal ray ray2, a beam of that light, spaced apart from the principal ray ray2 by −δy in the Y-axis direction, is defined as a light beam ray1, and a beam of that light, spaced apart from the principal ray ray2 by +δy in the Y-axis direction, is defined as a light beam ray3. In this case, the beam splitter 20 splits the principal ray ray2 into a reference light beam ray_r2 and a measurement light beam ray_m2. The beam splitter 20 also splits the light beam ray1 into a reference light beam ray_r1 and a measurement light beam ray_m1. The beam splitter 20 moreover splits the light beam ray3 into a reference light beam ray_r3 and a measurement light beam ray_m3.

The optical path lengths of the reference light and measurement light which are split and combined again by the beam splitter 20 will be considered. Let z0 be the position of the plane of the substrate SB in the Z-axis direction, where the reference light beam ray_r2 and measurement light beam ray_m2 split from the principal ray ray2 have the same optical path length (Optical path difference (OPD)=0). Also, let (x0, y1,z0), (x0,y2,z0), and (x0,y3,z0) be the intersection points (points defined in an X-Y-Z coordinate system) between the measurement light beams ray_m1 to ray_m3, respectively, and the X-Y plane at the position z0 in the Z-axis direction. Then, from the definition of the light beams ray1 and ray3, y1−y2=−δy and y3−y2=+δy, respectively. Further, the region (pixel position) on the image sensing device 24, to which the reference light beam ray_r1 and measurement light beam ray_m1 are guided, is defined as a first region pix1 (first detection unit). Similarly, the region on the image sensing device 24, to which the reference light beam ray_r2 and measurement light beam ray_m2 are guided, is defined as a second region pix2 (second detection unit), and the region on the image sensing device 24, to which the reference light beam ray_r3 and measurement light beam ray_m3 are guided, is defined as a third region pix3 (third detection unit).

The reference surface 40 is placed such that differences are generated among the respective optical path lengths between the measurement light beams and reference light beams which enter a plurality of regions on the image sensing device 24. In this embodiment, the reference surface 40 is tilted to form an angle (tilt angle) φ with the X-Z plane. Thus, the optical path differences OPD between the reference light beams reflected by the reference surface 40 and the measurement light beams reflected by the X-Y plane at the position z0 in the Z-axis direction when they interfere with each other on the image sensing device 24 are given by:

Optical path difference OPD1 between Reference Light Beam ray_r1 and Measurement Light Beam ray_m1=−2×δy×tan φ

Optical path difference OPD2 between Reference Light Beam ray_r2 and Measurement Light Beam ray_m2=0

Optical path difference OPD3 between Reference Light Beam ray_r3 and Measurement Light Beam ray_m3=+2×δy×tan φ

Note that the reference surface 40 is assumed to have a small tilt angle φ, and the forward path from the beam splitter 20 to the reference surface 40 and the backward path from the reference surface 40 to the beam splitter 20 are assumed to be identical to each other. However, to be precise, the forward path from the beam splitter 20 to the reference surface 40 and the backward path from the reference surface 40 to the beam splitter 20 are different from each other due to the influence of the tilt angle φ of the reference surface 40. Thus, the reference light and the measurement light naturally have different optical paths in an optical system downstream of the beam splitter 20, so optical simulation needs to be used to calculate their precise optical path difference. Nevertheless, when the reference surface 40 has a small tilt angle φ, the optical path differences can be approximately simplified as the above-mentioned equations because the tilt angle φ has little influence on the forward path from the beam splitter 20 to the reference surface 40, the backward path from the reference surface 40 to the beam splitter 20, and the optical path in an optical system downstream of the beam splitter 20.

Figure 2A:
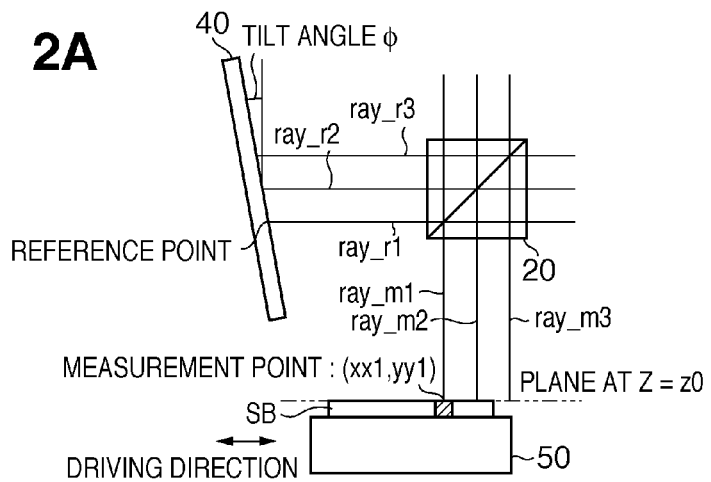
FIGS. 2A to 2C are views for explaining driving of a substrate to measure the surface shape of the substrate in the measurement apparatus shown in FIG. 1.
Figure 2B:
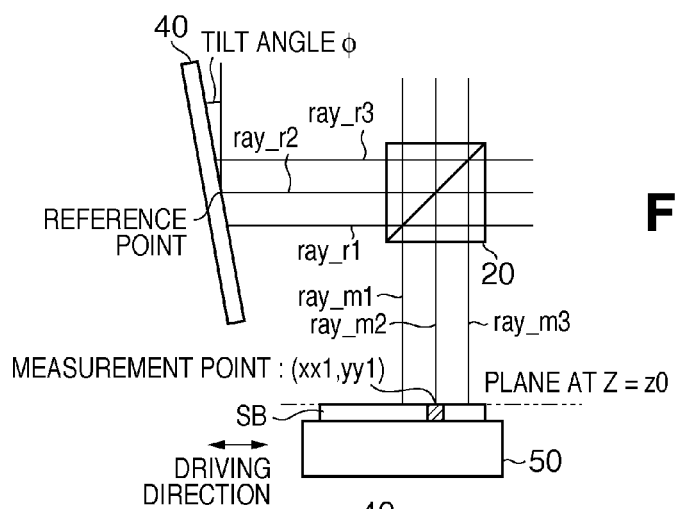
Figure 2C:
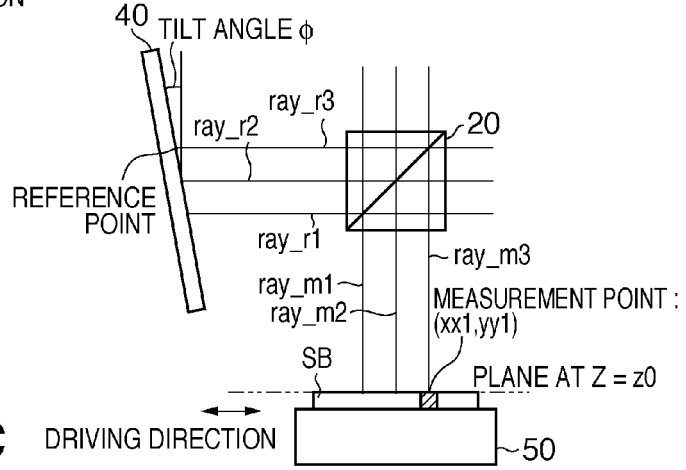

In this embodiment, to measure the surface shape of the substrate SB, the substrate SB is driven so that measurement light beams reflected at a measurement point on the substrate SB, and reference light beams reflected at reference points on the reference surface 40 corresponding to these measurement points sequentially enter a plurality of regions on the image sensing device 24. A mechanism in which the substrate SB is driven so that a measurement point (xx1,yy1) on the substrate SB moves in the X-Y plane at the position z0 in the Z-axis direction will be considered first. More specifically, as shown in FIGS. 2A to 2C, the substrate SB is driven so that the measurement point (xx1,yy1) on the substrate SB is positioned at the point (x0,y1,z0) at time t1, at the point (x0,y2,z0) at time t2, and at the point (x0,y3,z0) at time t3.

At time t1, the measurement light beam ray_m1 reflected at the measurement point (xx1,yy1) on the substrate SB, and the reference light beam ray_r1 reflected at a reference point on the reference surface 40 corresponding to the measurement point (xx1,yy1) (its position) enter the first region pix1 on the image sensing device 24. The intensity of an interfering light beam formed by the measurement light beam ray_m1 and the reference light beam ray_r1 is then detected in the first region pix1 on the image sensing device 24. At time t2, the measurement light beam ray_m2 reflected at the measurement point (xx1,yy1) on the substrate SB, and the reference light beam ray_r2 reflected at a reference point on the reference surface 40 corresponding to the measurement point (xx1,yy1) (its position at time t2) enter the second region pix2 on the image sensing device 24. The intensity of an interfering light beam formed by the measurement light beam ray_m2 and the reference light beam ray_r2 is then detected in the second region pix2 on the image sensing device 24. At time t3, the measurement light beam ray_m3 reflected at the measurement point (xx1,yy1) on the substrate SB, and the reference light beam ray_r3 reflected at a reference point on the reference surface 40 corresponding to the measurement point (xx1,yy1) (its position at time t3) enter the third region pix3 on the image sensing device 24. The intensity of an interfering light beam formed by the measurement light beam ray_m3 and the reference light beam ray_r3 is then detected in the third region pix3 on the image sensing device 24.

Figure 3:
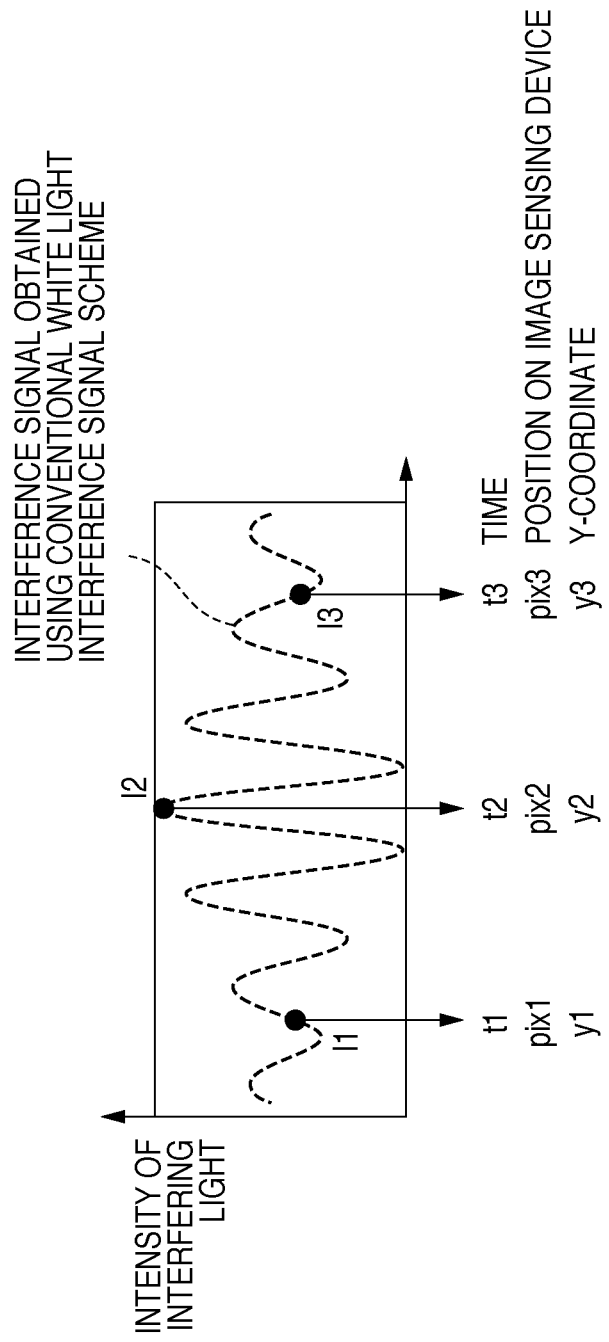
FIG. 3 is a graph illustrating one example of an intensity signal obtained by the measurement apparatus shown in FIG. 1.

The optical path differences OPD1, OPD2, and OPD3 are generated between the reference light beam ray_r1 and the measurement light beam ray_m1, between the reference light beam ray_r2 and the measurement light beam ray_m2, and between the reference light beam ray_r3 and the measurement light beam ray_m3, respectively. Thus, intensities I1, I2, and I3 of interfering light beams are sequentially detected in the first region pix1, second region pix2, and third region pix3, respectively, on the image sensing device 24, as shown in FIG. 3. In FIG. 3, a dotted line indicates an interference signal obtained using the conventional white light interference signal scheme (that is, the scheme of changing the height position (the position in the Z-axis direction) of the test surface). As can be seen by referring to FIG. 3, the intensities I1, I2, and I3 of interfering light beams detected in the first region pix1, second region pix2, and third region pix3, respectively, on the image sensing device 24 lie on the interference signal obtained using the conventional white light interference signal scheme.

In view of this, the reference surface 40 is tilted so that optical path differences are generated between the reference light beams and the measurement light beams upon driving the substrate SB in the Y-axis direction. The intensities of interfering light beams are detected in respective regions (pixels) on the image sensing device 24 corresponding to the number of measurement points when an interference signal is acquired using the conventional white light interference signal scheme. At this time, the substrate SB is driven so that the measurement light beams and the reference light beams sequentially enter a plurality of regions, which are arrayed in the Z axis direction (first direction) on the image sensing device 24 and at which the intensities of interfering light beams formed by the reference light beams and the measurement light beams are detected, while moving the substrate SB in the Y-axis direction. In this way, the measurement light beams reflected at the measurement point (xx1,yy1) on the substrate SB are detected in different regions on the image sensing device 24. Hence, a signal (intensity signal) equivalent to an interference signal obtained using the conventional white light interference signal scheme can be obtained by detecting the intensities of interfering light beams in regions on the image sensing device 24 corresponding to the coordinate positions of the substrate SB in the Y-axis direction.

Note that the position in the Z-axis direction (that is, the optical path difference between the reference light and the measurement light) is indicated on the abscissa in the interference signal obtained using the conventional white light interference signal scheme, whereas the position (region) on the image sensing device 24 is indicated on the abscissa in the intensity signal obtained in this embodiment, as shown in FIG. 3. In FIG. 3, to convert a position (region) on the image sensing device 24 into an optical path difference, the optical path difference between a reference light beam and a measurement light beam which enter that position can be used. The optical path differences OPD1, OPD2, and OPD3 are generated between the reference light beam ray_r1 and the measurement light beam ray_m1, between the reference light beam ray_r2 and the measurement light beam ray_m2, and between the reference light beam ray_r3 and the measurement light beam ray_m3, respectively, as described earlier. This makes it possible to convert a position on the image sensing device 24 into an optical path difference.

When the substrate SB is driven in the Y-axis direction along the X-Y plane at the position z0 in the Z-axis direction, it is often driven not only in the Y-axis direction but also in the Z-axis direction due to a driving error. In such a case, the optical path difference between the reference light and the measurement light changes from a set value by the amount of driving in the Z-axis direction due to a driving error of the substrate SB. Most driving errors of the substrate SB are generated due to poor adjustment of the laser interferometers which control the position of the stage 50. In view of this, a detection unit which detects a change in optical path difference between the reference light and the measurement light due to a driving error of the substrate SB need only be used to correct the intensity signal shown in FIG. 3 based on a change in optical path difference detected by the detection unit.

The height (the position in the Z-axis direction) of the substrate SB at a measurement point defined on it can be obtained by specifying a region (pixel position) on the image sensing device 24, where the intensity I2 that is a peak value of the intensity signal shown in FIG. 3 is detected. Also, the surface position of the substrate SB can be obtained by performing envelope peak detection or maximum contrast detection for the intensity signal. The surface position of the substrate SB can also be obtained by performing intensity peak or centroid calculation or function fitting such as quadratic approximation for an interference fringe at the center of the intensity signal (to be referred to as a "central fringe" hereinafter) to allow central fringe peak detection. The surface position of the substrate SB can moreover be obtained by performing moving averaging or function fitting for the intensity value of the intensity signal at a resolution about $1/10$ to $1/50$ the sampling pitch corresponding to the abscissa in FIG. 3.

The calculation processing unit 26 performs the above-mentioned processing (that is, driving of the substrate SB (that is, control of the stage which holds and drives the substrate SB) and calculation processing, which are necessary in measuring the surface shape of the substrate SB). The surface shape of the substrate SB calculated by the calculation processing unit 26 is, for example, stored in the storage unit 28 or displayed on the display unit 30.

Setting of the region (the number of pixels and the pixel size) on the image sensing device 24 and the tilt angle φ of the reference surface 40 will be explained in detail herein. To set the region on the image sensing device 24 and the tilt angle φ of the reference surface 40, it is necessary to determine the optical path difference between the reference light and the measurement light necessary for measurement. In the conventional white light interference signal scheme, the test surface is driven in the Z-axis direction to change the optical path difference between the reference light and the measurement light, thereby obtaining an interference signal. In the measurement apparatus 1, to obtain an intensity signal equivalent to an interference signal obtained using the conventional white light interference signal scheme, the tilt angle φ of the reference surface 40 need only be set such that an optical path difference equal to that obtained using the conventional white light interference signal scheme is generated within the region on the image sensing device 24.

A case in which, for example, the optical path difference between the reference light and the measurement light in the conventional white light interference signal scheme is 10 μm, and the number of measurement points is 100 will be considered. In this case, the reference surface 40 need only be placed such that the reference surface 40 has a tilt angle φ of a $\tan(10/1000)=0.57°$ with respect to an image sensing device 24 having 100 pixels (Effective Pixel Size: 1,000 μm) and a pixel size of 10 μm. Also, when an image sensing device having a larger number of pixels is adopted for the tilt angle φ, it is possible to increase the optical path difference between the reference light and the measurement light and thereby widen the detection range. Also, when the test surface placed on the stage has a tilt which changes depending on the placement state, a necessary optical path difference can be ensured by setting a relatively large tilt angle φ in consideration of the amount of change in tilt.

In the conventional white light interference signal scheme, an interference signal is generated using one region (pixel) on the image sensing device 24 to measure the height of the test surface at one measurement point defined on it. In contrast, in this embodiment, an intensity signal is generated using a plurality of regions (pixels) on the image sensing device 24 to measure the height of the test surface at one measurement point defined on it. Thus, if respective regions on the image sensing device 24 have different characteristics, this may distort the shape of the intensity signal or decrease the contrast of the intensity signal. In such a case, the pedestal value need only be corrected for each region on the image sensing device 24, or the linearity of the detection value for the amount of light need only be corrected for each region on the image sensing device 24.

The relationship between the timing to detect the intensity of an interfering light beam in each region on the image sensing device 24, and the driving (driving speed) of the substrate SB will be explained in detail next. In this embodiment, the stage 50 is driven to move a measurement light beam reflected at a measurement point on the substrate SB across each region (each pixel) on the image sensing device 24. For this reason, it is necessary to drive the substrate SB so that the time at which a measurement light beam reflected at a measurement point on the substrate SB moves across two adjacent regions on the image sensing device 24 coincides with or is earlier than the timing to detect a plurality of regions on the image sensing device 24.

A case in which, for example, the substrate SB (stage 50) is driven at 1,000 mm/sec with respect to an image sensing device 24 with a pixel size of 10 µm will be considered. In this case, since a time t, at which a measurement point on the substrate SB moves from a certain region to its adjacent region on the image sensing device 24 is t=10 [µm]/1000 [mm/sec]=0.01 [msec], the intensities of interfering light beams need only be detected at the interval of the time t.

If the detection timing in each region on the image sensing device 24 cannot be adjusted, the driving speed of the substrate SB (stage 50) or the pixel size of the image sensing device 24 can be adjusted instead. For example, when the detection timing in each region on the image sensing device 24 is 0.5 msec, the driving speed of the substrate SB (stage 50) can be set to 20 mm/sec or the pixel size of the image sensing device 24 can be set to 500 µm. This makes it possible to make the detection timing in each region on the image sensing device 24 earlier than the time at which a measurement light beam reflected at a measurement point on the substrate SB moves across each region (each pixel) on the image sensing device 24.

Figure 4A:
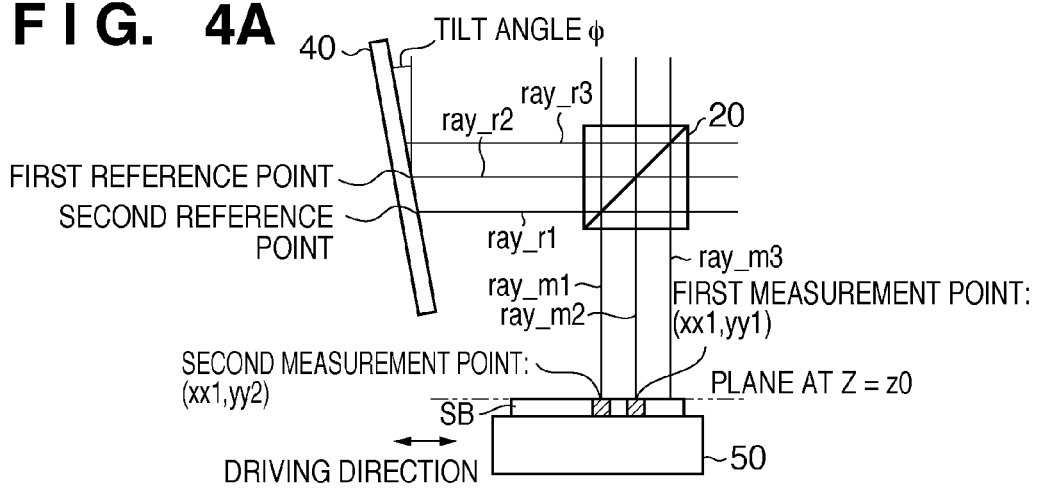
FIGS. 4A to 4C are views for explaining the reason why the measurement apparatus shown in FIG. 1 can measure the surface shape of a test surface in a short period of time.
Figure 4B:
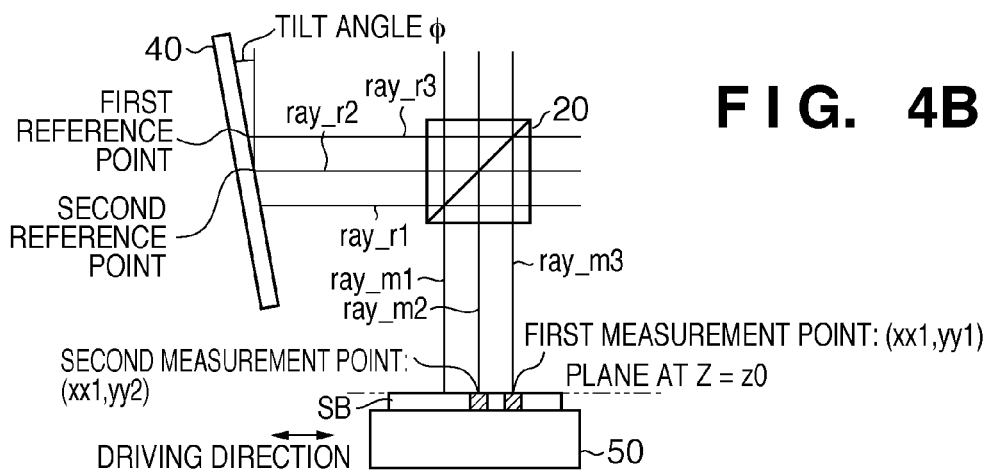
Figure 4C:
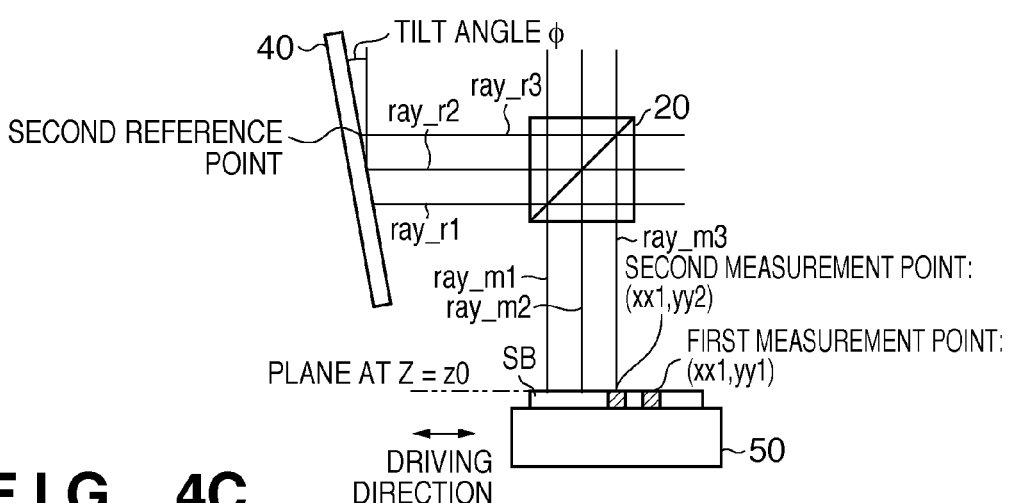

The reason why the measurement apparatus 1 according to this embodiment can measure the surface shape of a test surface in a short period of time while keeping the cost low will be given below with reference to FIGS. 4A to 4C. Measurement of the surface shape of the substrate SB has been explained by focusing attention only on the measurement point (xx1,yy1) on the substrate SB with reference to FIGS. 2A to 2C. Measurement of the surface shape of the substrate SB will be explained by focusing attention not only on the measurement point (xx1,yy1) but also on a measurement point (xx1,yy2) spaced apart from the measurement point (xx1,yy1) by −δy in the Y-axis direction with reference to FIGS. 4A to 4C. FIG. 4A shows the state at time t2, FIG. 4B shows the state at time t3, and FIG. 4C shows the state at time t4. Assume that the substrate SB is driven by +δy in the interval from time t2 to time t3, and driven by +δy in the interval from time t3 to time t4. Note that the measurement point (xx1,yy1) is defined as a first measurement point, and the measurement point (xx1,yy2) is defined as a second measurement point.

At time t2, the intensity of an interfering light beam formed by the measurement light beam ray_m2 reflected at the first measurement point on the substrate SB, and the reference light beam ray_r2 reflected at a first reference point on the reference surface 40 corresponding to the first measurement point is detected in the second region pix2 on the image sensing device 24. Note that the second measurement point on the substrate SB is spaced apart from the first measurement point by −δy in the Y-axis direction, as described earlier. Thus, at time t2, the intensity of an interfering light beam formed by the measurement light beam ray_m1 reflected at the second measurement point on the substrate SB, and the reference light beam ray_r1 reflected at a second reference point on the reference surface 40 corresponding to the second measurement point is detected in the first region pix1 on the image sensing device 24 at the same time.

At time t3, the intensity of an interfering light beam formed by the measurement light beam ray_m3 reflected at the first measurement point on the substrate SB, and the reference light beam ray_r3 reflected at the first reference point on the reference surface 40 corresponding to the first measurement point is detected in the third region pix3 on the image sensing device 24. At time t3, the intensity of an interfering light beam formed by the measurement light beam ray_m2 reflected at the second measurement point on the substrate SB, and the reference light beam ray_r2 reflected at the second reference point on the reference surface 40 corresponding to the second measurement point is detected in the second region pix2 on the image sensing device 24 at the same time.

At time t4, the intensity of an interfering light beam formed by the measurement light beam ray_m3 reflected at the second measurement point on the substrate SB, and the reference light beam ray_r3 reflected at the second reference point on the reference surface 40 corresponding to the second measurement point is detected in the third region pix3 on the image sensing device 24.

In this manner, an intensity signal corresponding to the first measurement point on the substrate SB is obtained in the interval from time t1 to time t3, while an intensity signal corresponding to the second measurement point on the substrate SB is obtained from time t2 to time t4.

Thus, letting i be the number of measurement points (that is, measurement points (xx1,yy1) to (xx1,yyi)) in the Y-axis direction on the substrate SB, the time taken to obtain intensity signals corresponding to these measurement points is determined from time t1 to time tk. Note that k=i+j where j is the sampling number necessary to generate intensity signals.

In this embodiment, to obtain intensity signals corresponding to a plurality of measurement points arrayed in the Y-axis direction on the substrate SB, the substrate SB need not be driven in the Z-axis direction, and need only be driven in the Y-axis direction (one direction) alone.

To measure the surface shape of the test surface using the conventional white light interference signal scheme, an operation of driving the test surface in the X- and Y-axis directions so that a measurement point on the test surface is located at a measurable position, and driving the test surface in the Z-axis direction to obtain an interference signal is repeated. Note that a region which can be measured by one operation of driving in the Z-axis direction is limited, so an operation of driving the test surface in the X- and Y-axis directions is repeated a plurality of times to measure the entire test surface. About 100 exposure regions called "shots" are present on a wafer in an exposure apparatus, and a region which can be measured by one operation of driving in the Z-axis direction generally includes about one or two shots. Thus, driving in the X- and Y-axis directions is necessary about 50 to 100 times. Although the number of times of driving in the X- and Y-axis directions can be reduced by widening a region which can be measured by one operation of driving in the Z-axis direction, this poses problems associated with the arrangement upon increasing the size of an optical system and problems, associated with the cost, such as necessity of a high-pixel-density image sensing device.

In contrast, the measurement apparatus 1 according to this embodiment drives the test surface so that a measurement point on the test surface is located at a measurable position and, for example, drives the test surface in the Y-axis direction to obtain intensity signals corresponding to measurement points arrayed in the Y-axis direction. The measurement apparatus 1 then repeats an operation of driving the test surface in the X-axis direction to measure the next measurement point on the test surface, and driving the test surface in the Y-axis direction to obtain an intensity signal corresponding to that measurement point. In this manner, since the measurement apparatus 1 need not drive the test surface in the Z-axis direction and can detect a plurality of measurement points, arrayed in the Y-axis direction on the test surface, by one operation of driving in the Y-axis direction, it can measure the surface shape of the test surface in a short period of time. Around 100 shots are juxtaposed on a wafer in an exposure apparatus, as described earlier, so shots are present in about 10 rows in the X-axis direction. Hence, when the measurement apparatus 1 according to this embodiment measures shots, it needs to drive the test surface in the X-axis direction only about 10 times to measure the next shot.

For example, assume that the sampling number at each measurement point is 100, the number of measurement points in the Y-axis direction in each shot is 100, the time taken to drive the test surface to the next measurement point is 10 msec, and the time taken to accelerate/decelerate driving in the Z-axis direction is 10 msec. The conventional white light interference signal scheme requires 99 times (990 msec) of driving to the next measurement point, and 100 times (1 sec) of driving in the Z-axis direction, so it requires a measurement time of about 1.99 sec. In contrast, the measurement apparatus 1 according to this embodiment requires only nine times (90 msec) of driving to the next measurement point, and does not require driving in the Z-axis direction, so it can shorten the measurement time by about 1 sec as compared with the conventional white light interference signal scheme.

Although a case in which the reference surface 40 has a small tilt angle $\phi$ has been explained in this embodiment, the reference surface 40 sometimes has too large a tilt angle $\phi$ to approximately simplify the optical path differences using the above-mentioned equations. In such a case, it is possible to drive the test surface in the Z-axis direction at each measurement point, obtain actual optical path differences using the conventional white light interference signal scheme, and correct an OPD error based on the obtained optical path differences.

Figure 5:
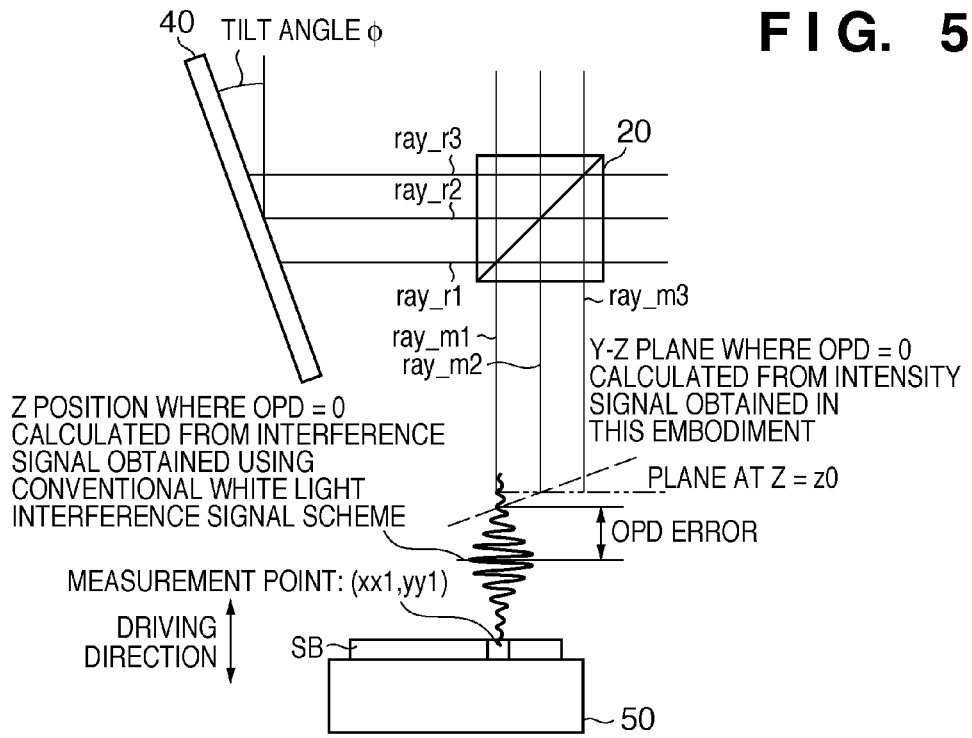
FIG. 5 is a view for explaining correction of an OPD error in the measurement apparatus shown in FIG. 1.

More specifically, as shown in FIG. 5, first, the measurement point (xx1,yy1) on the substrate SB is located at the point (x0,y1,z0) in the X-Y-Z coordinate system. Subsequently, the substrate SB is driven in the Z-axis direction to acquire an interference signal, and the peak of the interference signal is detected, as in the conventional white light interference signal scheme. In this way, the position of the plane of the substrate SB in the Z-axis direction, where the optical path difference OPD between the reference light beam ray_r1 and the measurement light beam ray_m1 in the first region pix1 on the image sensing device 24 which receives the measurement light beam ray_m1 becomes zero, is calculated. The optical path difference OPD at each position of the substrate SB in the Z-axis direction at the measurement point (xx1,yy1) can also be calculated from the interference signal.

The optical path difference OPD between the reference light beam ray_r1 and the measurement light beam ray_m1 in the first region pix1 on the image sensing device 24 which receives the measurement light beam ray_m1 can also be calculated from the tilt angle $\phi$ of the reference surface 40 (that is, from the intensity signal obtained in this embodiment). Then, the difference between the optical path difference OPD calculated from the interference signal obtained using the conventional white interference signal scheme, and that calculated from the intensity signal obtained in this embodiment is an OPD error at the point (x0,y1,z0) in the X-Y-Z coordinate system.

An OPD error when the reference surface 40 has a large tilt angle $\phi$ can be corrected by obtaining OPD errors over the entire region irradiated with the measurement light (the region irradiated with the measurement light beams ray_m1 to ray_m3 in FIG. 5). Once an OPD error is obtained, it need not be obtained again at subsequent measurement times.

OPD error calculation is intended mainly to obtain the optical path difference inside the optical system of the measurement apparatus 1, and not to obtain the optical path difference due to factors associated with the material of the test surface. However, a measurement error may increase in OPD error calculation if a multilayer structure is formed on the test surface. To prevent this, a BaSi wafer, a glass wafer, a wafer coated with a single thick resist, or a reference plate, for example, is desirably used as the test surface to calculate an OPD error.

Although the measurement apparatus 1 shown in FIG. 1 perpendicularly irradiates the substrate SB as the test surface with the measurement light, it may obliquely irradiate the substrate SB with the measurement light. In this case, the reflectance of a resist layer applied on the upper portion of the substrate SB increases, and this reduces the influence of light reflected by, for example, a metal layer present under the resist layer. This makes it possible to measure the surface shape of the substrate SB with higher accuracy.

Although the measurement apparatus 1 shown in FIG. 1 adopts dioptric systems as an illumination system and a detection system, it can also adopt catoptric systems. The use of catoptric systems allows reductions in aberration of the optical systems. This makes it possible to measure the surface shape of the substrate SB with higher accuracy. For example, assume that the light source 10 emits white light in a wide wavelength range. In this case, the number of lenses normally needs to be increased to reduce the aberrations of the optical systems, but the use of catoptric systems allows reductions in aberration without increasing the number of lenses. In other words, a catoptric system is advantageous in performance and cost as compared with a dioptric system.

Figure 6:
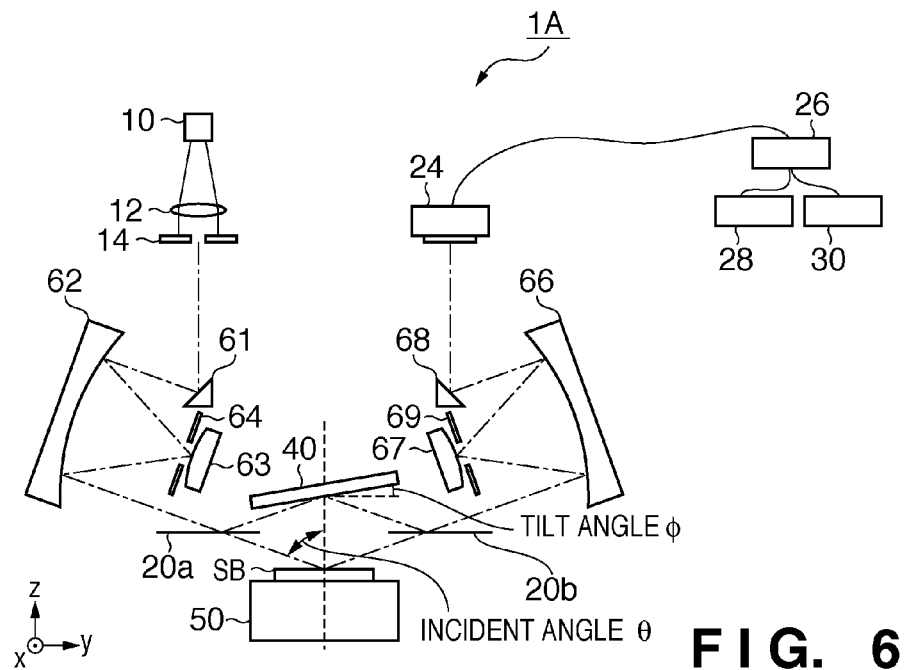
FIG. 6 is a schematic view showing another arrangement of the measurement apparatus according to one aspect of the present invention.

FIG. 6 is a schematic view showing the arrangement of a measurement apparatus 1A which obliquely irradiates a substrate SB with the measurement light, and adopts catoptric systems as an illumination system and a detection system. The measurement apparatus 1A includes a flat plane mirror 61, concave mirror 62, convex mirror 63, and aperture stop 64, which constitute an illumination system. The measurement apparatus 1A also includes a concave mirror 66, convex mirror 67, flat plane mirror 68, and aperture stop 69, which constitute a detection system. The flat plane mirrors 61 and 68 need not be used if a space sufficient to accommodate these systems can be secured.

The concave mirror 62 and convex mirror 63 form an imaging optical system in the illumination system. In this embodiment, the concave mirror 62 and convex mirror 63 are arranged to have identical centers of curvature (have concentric circles of curvature). In other words, the concave mirror 62 and convex mirror 63 are arranged in a relationship called the Offner configuration. However, the concave mirror 62 and convex mirror 63 may be arranged to have different centers of curvature (have non-concentric circles of curvature) by setting the curvature of the convex mirror 63 (convex curvature) twice that of the concave mirror 62 (concave curvature) (that is, Convex Curvature=2×(Concave Curvature)). The aperture stop 64 is placed at the pupil position of the imaging optical system formed from the concave mirror 62 and convex mirror 63, and defines the numerical aperture (NA) of the imaging optical system.

The concave mirror 66 and convex mirror 67 form an imaging optical system in the detection system. The concave mirror 66 and convex mirror 67 are arranged to have identical centers of curvature (have the Offner configuration), like the concave mirror 62 and convex mirror 63 in the illumination system. However, the concave mirror 66 and convex mirror 67 may be arranged to have different centers of curvature by setting the curvature of the convex mirror 67 twice that of the concave mirror 66. The aperture stop 69 is placed at the pupil position of the imaging optical system formed from the concave mirror 66 and convex mirror 67, and defines the numerical aperture (NA) of the imaging optical system. In this embodiment, the aperture stop 69 stops down the imaging optical system to an NA as very low as about $\sin(0.1°)$ to $\sin(5°)$.

Each of beam splitters 20a and 20b is a prism type beam splitter formed from a metal film, a dielectric multilayer film, or another film as a split film, or a pellicle type beam splitter formed from a film as thin as about 1 µm to 5 µm, as described earlier.

The principal ray of the light having passed through the concave mirror 62 and convex mirror 63 enters the beam splitter 20a inserted between the concave mirror 62 and the substrate SB. Thus, an almost half (measurement light) of the light having passed through the concave mirror 62 and convex mirror 63 is transmitted through the beam splitter 20a and enters the substrate SB at an incident angle φ. Also, almost the other half (reference light) of the light having passed through the concave mirror 62 and convex mirror 63 is reflected by the beam splitter 20a and enters the reference surface 40 at the incident angle φ.

As the incident angle φ of the measurement light which enters the substrate SB increases, the reflectance of the upper surface of a thin film (resist) applied on the substrate SB becomes stronger than that of the lower surface of the thin film. In view of this, the larger the incident angle φ, the higher the accuracy of measurement of the surface shape of a thin film applied on the substrate SB becomes. Nevertheless, it becomes more difficult to assemble an optical system as the incident angle φ becomes closer to 90°, so the incident angle φ desirably is 70° to 85°.

Measurement light that is transmitted through the beam splitter 20a and enters the substrate SB is reflected by the substrate SB and enters the beam splitter 20b. On the other hand, reference light that is reflected by the beam splitter 20a and enters a reference surface 40 is reflected by the reference surface 40 and enters the beam splitter 20b.

The measurement light reflected by the substrate SB and the reference light reflected by the reference surface 40 are combined by the beam splitter 20b, and received by an image sensing device 24. The concave mirror 66 and convex mirror 67 form a bilateral telecentric imaging optical system, which images the surface of the substrate SB on the image sensing device 24. Thus, in this embodiment, the transmission region in a slit plate 14 is imaged on the substrate SB and reference surface 40 by the concave mirror 62 and convex mirror 63, and imaged again on the image sensing device 24 by the concave mirror 66 and convex mirror 67. The measurement light and the reference light are superposed on each other (that is, interfere with each other) on the image sensing device 24, and the intensity of interfering light formed by the measurement light and the reference light is detected by the image sensing device 24. Note that the placement of the reference surface 40 (the setting of the tilt angle φ of the reference surface 40), the arrangement of the image sensing device 24, the process of calculating the surface shape of the substrate SB by a calculation processing unit 26, and other features in the measurement apparatus 1A are the same as the measurement apparatus 1.

Figure 7:
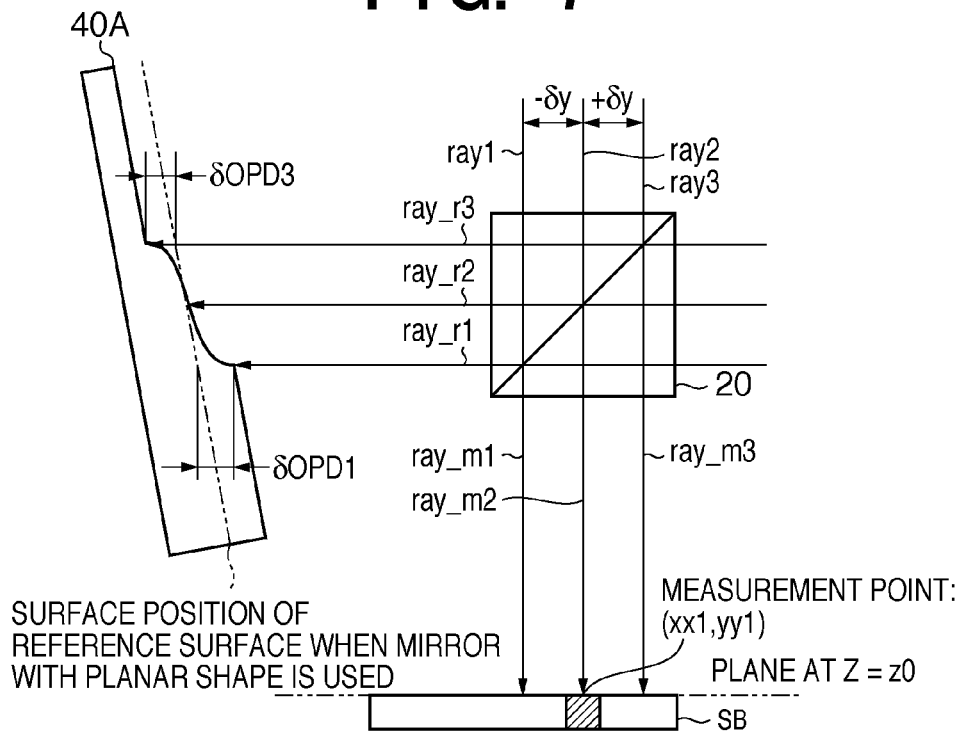
FIG. 7 is a schematic view showing the arrangement of a reference surface applicable to the measurement apparatuses shown in FIGS. 1 and 6.

Although each of the measurement apparatus 1 shown in FIG. 1 and the measurement apparatus 1A shown in FIG. 6 uses a mirror with a planar (flat plane) shape as the reference surface 40, a mirror 40A with a non-planar shape may be used, as shown in FIG. 7. Referring to FIG. 7, the mirror 40A with a non-planar shape generates an optical path difference between the reference light beam ray_r1 and the measurement light beam ray_m1, which is shorter than that generated by a mirror with a planar shape by δOPD1. Similarly, the mirror 40A generates an optical path difference between the reference light beam ray_r3 and the measurement light beam ray_m3, which is shorter than that generated by a mirror with a planar shape by δOPD3. This makes it possible to change the optical path difference between the reference light and the measurement light by different amounts upon driving the substrate SB at a constant speed in the Y-axis direction. This, in turn, makes it possible to change the interval of sampling points for intensity signals. As described above, in this embodiment, the height of the substrate SB at a measurement point defined on it is calculated by performing envelope peak detection for the intensity signal, or centroid calculation or function fitting for the central fringe of the intensity signal. At this time, the vicinity of a portion where the intensity of the intensity signal is maximized often influences centroid calculation or function fitting. The use of the mirror 40A with a non-planar shape, as shown in FIG. 7, makes it possible to decrease the sampling number in a portion where the intensity is relatively low, and increase the sampling number in a portion where the intensity is maximized. This makes it possible to improve measurement accuracy.

Figure 8:
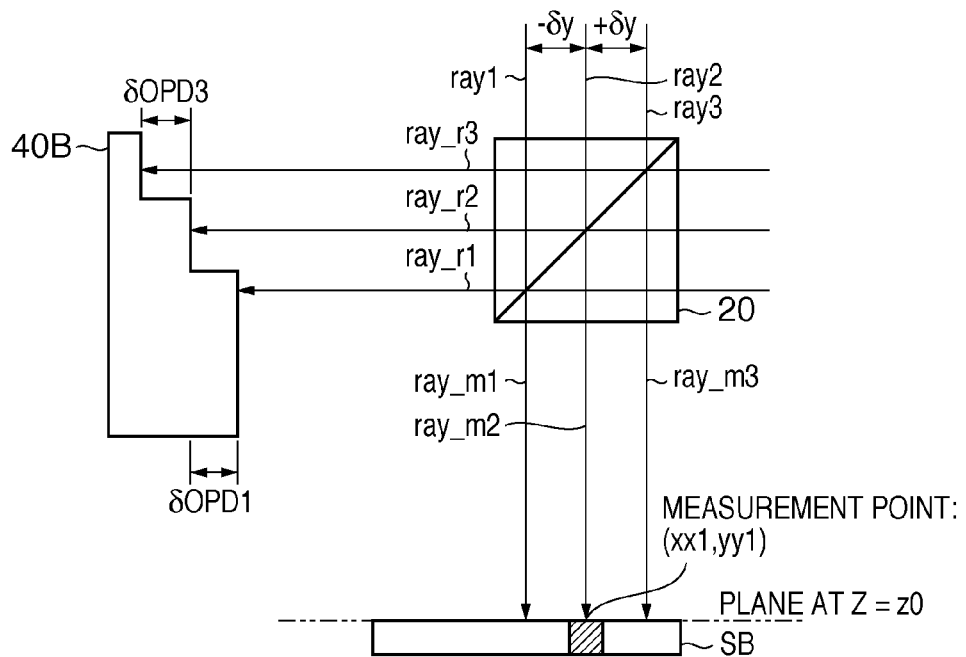
FIG. 8 is a schematic view showing the arrangement of another reference surface applicable to the measurement apparatuses shown in FIGS. 1 and 6.

A mirror 40B with a step shape, having different steps in correspondence with respective regions on the image sensing device 24, may also be used as the reference surface 40, as shown in FIG. 8. Referring to FIG. 8, the mirror 40B has steps that generate an optical path difference between the reference light beam ray_r1 and the measurement light beam ray_m1, which is shorter than that generated by a mirror with a planar shape by δOPD1. Similarly, the mirror 40B has steps that generate an optical path difference between the reference light beam ray_r3 and the measurement light beam ray_m3, which is shorter than that generated by a mirror with a planar shape by δOPD3.

Each of a mirror with a planar shape (FIGS. 1 and 6) and a mirror with a non-planar shape (FIG. 7) generates an optical path difference which does not stay constant in one pixel (one region) on the image sensing device 24, so the average intensity of interfering light is detected. In contrast, a mirror with a step shape (FIG. 8) generates an optical path difference which stays constant in one pixel (one region) on the image sensing device 24. Hence, the latter mirror generates an intensity signal with higher contrast and is therefore excellent in measurement reproducibility.

A non-planar shape as shown in FIG. 7 or a step shape as shown in FIG. 8 can also be formed by applying an external force to a mirror with a planar shape (that is, by changing the planar shape).

Also, each of the measurement apparatus 1 shown in FIG. 1 and the measurement apparatus 1A shown in FIG. 6 uses the reference surface 40 being tilted or uses a mirror with a non-planar shape or a mirror with a step shape as the reference surface 40 to change the optical path difference between the reference light and the measurement light. However, the optical path difference between the reference light and the measurement light can also be changed by tilting the substrate SB in place of the reference surface 40.

Figure 9:
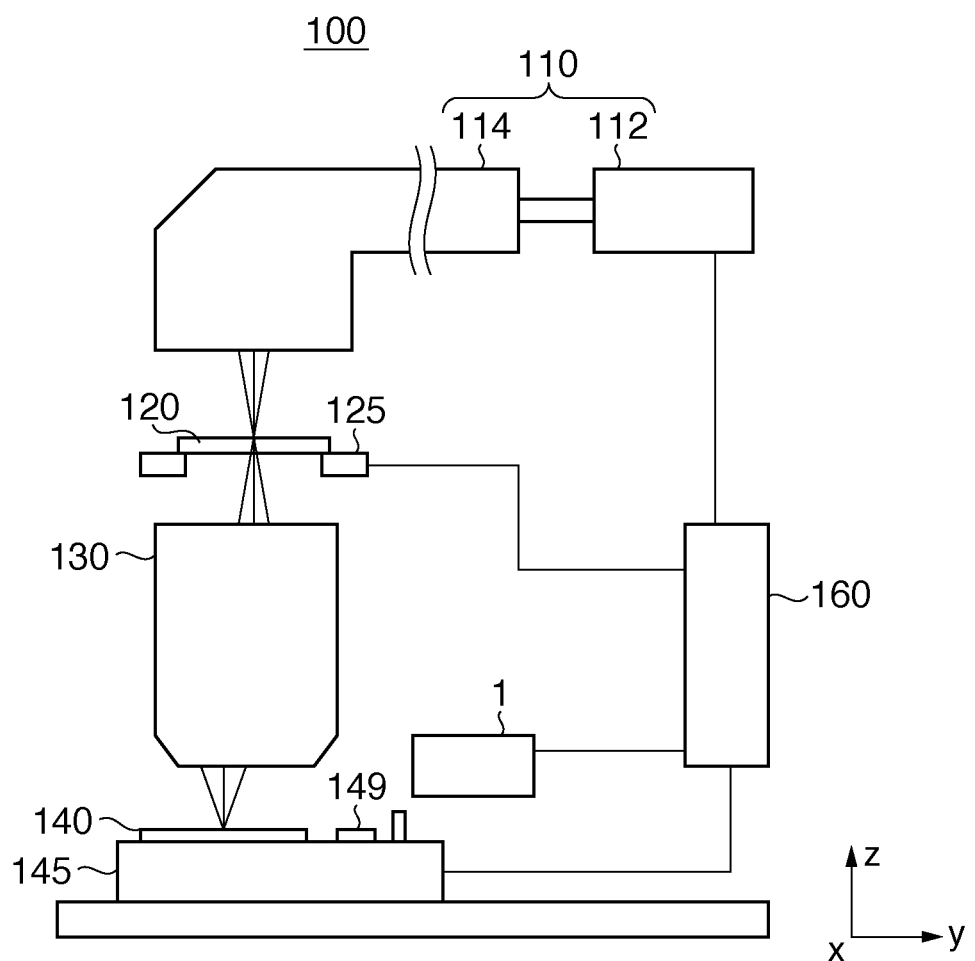
FIG. 9 is a schematic view showing the arrangement of an exposure apparatus according to one aspect of the present invention.

An exposure apparatus 100 including a measurement apparatus 1 or 1A will be described next with reference to FIG. 9. FIG. 9 is a schematic view showing the arrangement of the exposure apparatus 100 according to one aspect of the present invention.

In this embodiment, the exposure apparatus 100 is a projection exposure apparatus which transfers the pattern of a reticle 120 onto a wafer 140 by exposure using the step & scan scheme. However, the exposure apparatus 100 can also adopt the step & repeat scheme or another exposure scheme.

The exposure apparatus 100 includes an illumination device 110, a reticle stage 125 which mounts the reticle 120, a projection optical system 130, a wafer stage 145 which mounts the wafer 140, a control unit 160, and the measurement apparatus 1, as shown in FIG. 9.

The illumination device 110 illuminates the reticle 120 on which a pattern to be transferred is formed, and includes a light source 112 and illumination optical system 114. The illumination optical system 114 illuminates the reticle 120 with light from the light source 112. In this embodiment, the illumination optical system 114 forms an exposure slit with a shape optimum for exposure.

The reticle 120 has a pattern to be transferred, and is supported and driven by the reticle stage 125. Light diffracted by the reticle 120 is projected onto the wafer 140 upon passing through the projection optical system 130. The reticle 120 and wafer 140 are placed optically conjugate to each other. Note that the exposure apparatus 100 includes a reticle detection unit of the light oblique incidence system (not shown), and the reticle 120 has its position detected by the reticle detection unit and placed at a predetermined position.

The reticle stage 125 supports the reticle 120 via a reticle chuck (not shown), and is connected to a moving mechanism (not shown). The moving mechanism includes, for example, a linear motor, and drives the reticle stage 125 in the X-, Y-, and Z-axis directions and rotation directions about the respective axes.

The projection optical system 130 projects the pattern of the reticle 120 onto the wafer 140. The projection optical system 130 can be a dioptric system, a catadioptric system, or a catoptric system.

The wafer 140 is a substrate onto which the pattern of the reticle 120 is projected (transferred), and is supported and driven by the wafer stage 145. However, a glass plate or another substrate can also be used in place of the wafer 140. The wafer 140 is coated with a resist.

The wafer stage 145 supports the wafer 140 via a wafer chuck (not shown). The wafer stage 145 moves the wafer 140 in the X-, Y-, and Z-axis directions and rotation directions about the respective axes using a linear motor, like the reticle stage 125. Also, a reference plate 149 is placed on the wafer stage 145.

The measurement apparatus 1 has a function of measuring the surface shape of the wafer 140, and can take any of the above-mentioned forms. Also, when the exposure apparatus 100 includes a focus control sensor in addition to the measurement apparatus 1, the measurement apparatus 1 can also be used to calibrate the focus control sensor.

The control unit 160 includes a CPU and memory, and controls the operation of the exposure apparatus 100. In this embodiment, the control unit 160 adjusts the position of the wafer 140 based on the surface shape of the wafer 140 measured by the measurement apparatus 1. The control unit 160 may have the function of a calculation processing unit 26 of the measurement apparatus 1.

In exposure, light emitted by the light source 112 illuminates the reticle 120 by the illumination optical system 114. Light which bears the information of the pattern of the reticle 120 forms an image on the wafer 140 by the projection optical system 130. At this time, the wafer 140 needs to be aligned. Since the measurement apparatus 1 can measure the surface shape of the wafer 140 in a short period of time, as described earlier, the exposure apparatus 100 can align the wafer 140 in a short period of time. Hence, the exposure apparatus 100 can provide high-quality devices (for example, a semiconductor device, an LCD device, an image sensing device (for example, a CCD), and a thin film magnetic head) with a high throughput and good economical efficiency. These devices are fabricated by a step of exposing a substrate (for example, a wafer or a glass plate) coated with a photosensitive agent using the exposure apparatus 100, a step of developing the exposed substrate (photosensitive agent), and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-186143 filed on Aug. 10, 2009, which is hereby incorporated by reference herein in its entirety.

What is claimed is:

1. A measurement apparatus for measuring a height of a test surface, the apparatus comprising:
    an image sensing device including a plurality of detection units arranged along a first direction and configured to detect interfering light formed by measurement light from the test surface illuminated by white light and reference light from a reference surface illuminated by white light;
    an optical system configured to guide the measurement light and the reference light to said plurality of detection units; and
    a processing unit configured to calculate the height of the test surface by performing arithmetic processing using data on intensities of the interfering light detected by said plurality of detection units,
    wherein the reference surface is placed so that differences are generated among optical path differences between measurement light beams from a plurality of measurement points and reference light beams from a plurality of reference points which enter said plurality of detection units, respectively,
    wherein said plurality of detection units detect the interfering light when the test surface is moved so that a measurement light beam reflected at one measurement point on the test surface enters said plurality of detection units in series along the first direction while the test surface is moved, and
    wherein said processing unit specifies, using intensity signals of the interfering light detected by the plurality of detection units arranged in the first direction, a peak position of intensity signal of the interfering light in the first direction, and calculates the height of the one measurement point based on the specified peak position.

2. The apparatus according to claim 1, wherein:
the reference surface has steps, which become higher in order, between the plurality of reference points defined thereon, and
the steps generate differences among the optical path differences between the measurement light beams and the reference light beams which enter said plurality of detection units, respectively.

3. The apparatus according to claim 1, wherein the reference surface has a non-planar shape generating the difference among optical path length differences.

4. The apparatus according to claim 1, further comprising:
a change detection unit configured to detect a change in optical path difference between the measurement light reflected by the one measurement point and the reference light reflected by the respective reference point due to a driving error of the test surface,
wherein said processing unit corrects the intensity signal of the interfering light based on the change in optical path difference detected by the change detection unit.

5. The apparatus according to claim 1, wherein the test surface is moved so that a time at which the measurement light reflected by the one measurement point moves across two adjacent detection units of the plurality of detection units coincides with a timing to detect the interfering light by the plurality of detection units.

6. An exposure apparatus comprising:
a projection optical system configured to project a pattern of a reticle onto a substrate;
a measurement apparatus configured to measure a height of the substrate to obtain a surface shape of the substrate; and
a stage configured to adjust a position of the substrate based on the surface shape of the substrate measured by said measurement apparatus,
wherein said measurement apparatus comprises:
an image sensing device including a plurality of detection units arranged along a first direction and configured to detect interfering light formed by measurement light from the test surface illuminated by white light and reference light from a reference surface illuminated by white light;
an optical system configured to guide the measurement light and the reference light to said plurality of detection units; and
a processing unit configured to calculate the height of the test surface by performing arithmetic processing using data on intensities of the interfering light detected by said plurality of detection units,
wherein the reference surface is placed so that differences are generated among optical path differences between measurement light beams from a plurality of measurement points and reference light beams from a plurality of reference points which enter said plurality of detection units, respectively,
wherein said plurality of detection units detect the interfering light when the test surface is moved so that a measurement light beam reflected at one measurement point on the test surface enters said plurality of detection units in series along the first direction while the test surface is moved, and
wherein said processing unit specifies, using intensity signals of the interfering light detected by the plurality of detection units arranged in the first direction, a peak position of intensity signal of the interfering light in the first direction, and calculates the height of the one measurement point based on the specified peak position.

7. A device fabrication method comprising steps of:
exposing a substrate using an exposure apparatus; and
developing the exposed substrate,
wherein the exposure apparatus includes:
a projection optical system configured to project a pattern of a reticle onto the substrate;
a measurement apparatus configured to measure a height of the substrate to obtain a surface shape of the substrate; and
a stage configured to adjust a position of the substrate based on the surface shape of the substrate measured by said measurement apparatus,
wherein the measurement apparatus includes:
an image sensing device including a plurality of detection units arranged along a first direction and configured to detect interfering light formed by measurement light from the substrate illuminated by white light and reference light from a reference surface illuminated by white light;
an optical system configured to guide the measurement light and the reference light to said plurality of detection units; and
a processing unit configured to calculate the height of the test surface by performing arithmetic processing using data on intensities of the interfering light detected by said plurality of detection units,
wherein the reference surface is placed so that differences are generated among optical path differences between measurement light beams from a plurality of measurement points and reference light beams from a plurality of reference points which enter said plurality of detection units, respectively,
wherein said plurality of detection units detect the interfering light when the substrate is moved so that a measurement light beam reflected at one measurement point on the substrate enters said plurality of detection units in series along the first direction while the substrate is moved, and
wherein said processing unit specifies, using intensity signals of the interfering light detected by the plurality of detection units arranged in the first direction, a peak position of intensity signal of the interfering light in the first direction, and calculates the height of the one measurement point based on the specified peak position.

* * * * *